United States Patent
Chao et al.

(10) Patent No.: US 7,151,317 B2
(45) Date of Patent: Dec. 19, 2006

(54) MULTI-CHIP PACKAGE STRUCTURE

(75) Inventors: Shin-Hua Chao, Kaohsiung (TW); Jian-Wen Lo, Taipei County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/904,404

(22) Filed: Nov. 9, 2004

(65) Prior Publication Data

US 2005/0199991 A1 Sep. 15, 2005

(30) Foreign Application Priority Data

Mar. 12, 2004 (TW) .............................. 93106614 A

(51) Int. Cl.
*H01L 23/48* (2006.01)

(52) U.S. Cl. ...................... 257/777; 257/778; 257/779; 257/E21.503; 257/E21.511; 438/107; 438/108; 438/613; 438/612

(58) Field of Classification Search ................ 257/777, 257/778, 779, E21.503, E21.511; 438/112
See application file for complete search history.

(56) References Cited

U.S. PATENT DOCUMENTS 6,906,415 B1 * 6/2005 Jiang et al. .................. 257/723
6,921,968 B1 * 7/2005 Chung ......................... 257/686
2004/0164390 A1 * 8/2004 Wang .......................... 257/686

* cited by examiner

*Primary Examiner*—Brook Kebede
*Assistant Examiner*—Su C. Kim
(74) *Attorney, Agent, or Firm*—Jiang Chyun IP Office

(57) ABSTRACT

A multi-chip package structure comprising a first chip, a patterned lamination layer, a plurality of first bumps, a second chip and second bumps is provided. The first chip has a first active surface. The patterned lamination layer is disposed on a portion area of the first active surface. The first chip has a plurality of first bonding pads disposed on the first active surface exposed by the patterned lamination layer and the patterned lamination layer has a plurality of second bonding pads disposed thereon. The second chip has a second active surface and the first bumps are disposed on the second active surface. The second chip is electrically connected to the first bonding pads through the first bumps. The second bumps are disposed on the second bonding pads. Moreover, the multi-chip package structure further comprises a component disposed on the first chip and electrically connects to the first bonding pads.

16 Claims, 3 Drawing Sheets

MULTI-CHIP PACKAGE STRUCTURE

CROSS-REFERENCE TO RELATED APPLICATION

This application claims the priority benefit of Taiwan application serial no. 93106614, filed Mar. 12, 2004.

BACKGROUND OF THE INVENTION

1. Field of the Invention

The present invention relates to a multi-chip package structure. More particularly, the present invention relates to a multi-chip package structure having a patterned lamination layer capable of improving reliability.

2. Description of Related Art

With the progressive advancement of electronic technology, miniaturization of electronic products has become increasingly important. This miniaturization results in a more complicated and denser structure of electronic products. In electronic industries, the packaging of electronic devices thus requires package structures that have small dimensions and high density. In this context, many types of packaging structures are being developed, such as ball grid array (BGA) packages, chip-scale packages (CSP), flip-chip (F/C) packages, multi-chip module (MCM) packages, etc. Among the above-mentioned types of packaging structures, the flip-chip packages advantageously allow for a packaging structure that has a small size, high pin counts, a short signal path, a low induction and a control of noise signals. Thus, the flip-chip structure is widely used in packaging electronic devices.

Recently, IC manufacturers propose some die-to-die packages. In the die-to-die package, at least one passive component or chip having low pin-counts is disposed face-to-face on a chip having high pin-counts, wherein the chips are electrically connected to each other through conductive bumps. Moreover, the chips are electrically connected to each other through solder bumps, and the chip having high pin-counts is electrically connected to a carrier through bumps or bonding wires.

FIG. 1 is a schematic cross-sectional view of a conventional multi-chip package structure. Referring to FIG. 1, a conventional multi-chip package structure 100 is electrically connected to a carrier 50. The multi-chip package structure 100 includes a first chip 110, a plurality of first bumps 130, a second chip 140 and a plurality of second bumps 150. The first chip 110 has a first active surface 112, wherein a plurality of first bonding pads 114 and second bonding pads 116 are disposed on the first active surface 112. The first bumps 130 are disposed on the first bonding pads 114 and electrically connected to the carrier 50. The second chip 140 has a second active surface 142, wherein a plurality of third bonding pads 144 is disposed on the second active surface 142. Furthermore, the third bonding pads 144 are electrically connected to the second bonding pads 116 through the second bumps 150.

As mentioned above, since the space for accommodating the second chip 140 and the second bumps 150 is limited by the height of the first bumps 130, reliability of the connection between the first chip 110 and the second chip 140 is deteriorated. Therefore, feasibility of manufacturing the multi-chip package structure 100 is reduced significantly.

SUMMARY OF THE INVENTION

The invention provides a multi-chip package structure capable of improving reliability thereof.

As embodied and broadly described herein, the invention provides a multi-chip package structure. The multi-chip package structure comprises a first chip, a patterned lamination layer, a plurality of first bumps, a second chip and a plurality of second bumps. The first chip has a first active surface. The patterned lamination layer is disposed on a portion area of the first active surface. The first chip has a plurality of first bonding pads disposed on the first active surface exposed by the patterned lamination layer and the patterned lamination layer has a plurality of second bonding pads disposed thereon. The second chip has a second active surface and the first bumps are disposed on the second active surface. The second chip is electrically connected to the first bonding pads through the first bumps. The second bumps are disposed on the second bonding pads.

Moreover, the present invention further provides a multi-chip package structure. The multi-chip package structure comprises a first chip, a patterned lamination layer, a plurality of first bumps, a second chip and a plurality of second bumps. The first chip has a first active surface. The patterned lamination layer is disposed on a portion of the first active surface. The first chip has a plurality of first bonding pads disposed on the first active surface exposed by the patterned lamination layer and the patterned lamination layer has a plurality of second bonding pads disposed thereon. The second chip has a second active surface and the first bumps are disposed on the second active surface. The second chip is electrically connected to a portion of the first bonding pads through the first bumps. The component is disposed on the first chip and electrically connected to the other first bonding pads. The second bumps are disposed on the second bonding pads.

In an embodiment of the present invention, the component is, for example, a surface mount device.

In an embodiment of the present invention, the multi-chip package structure further comprises a plurality of third bumps disposed on the other first bonding pads, such that the component is electrically connected to the first chip.

In an embodiment of the present invention, a size of the second chip is smaller than an area of the first active surface exposed by the patterned lamination layer. The patterned lamination layer is, for example, a ring type pattern or a multi-stripe type pattern. The patterned lamination layer is, for example, a re-distribution circuit layer or a component circuit layer that is electrically integrated with the first chip. In addition, the patterned lamination layer has a first thickness T1, the second chip has a second thickness T2, each first bump has a first height H1 and each second bump has a second height H2, and T1+H2>T2+H1. The multi-chip package structure mentioned above further comprises a carrier, electrically connected to the first chip through the second bumps.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

First Embodiment

Figure 1:
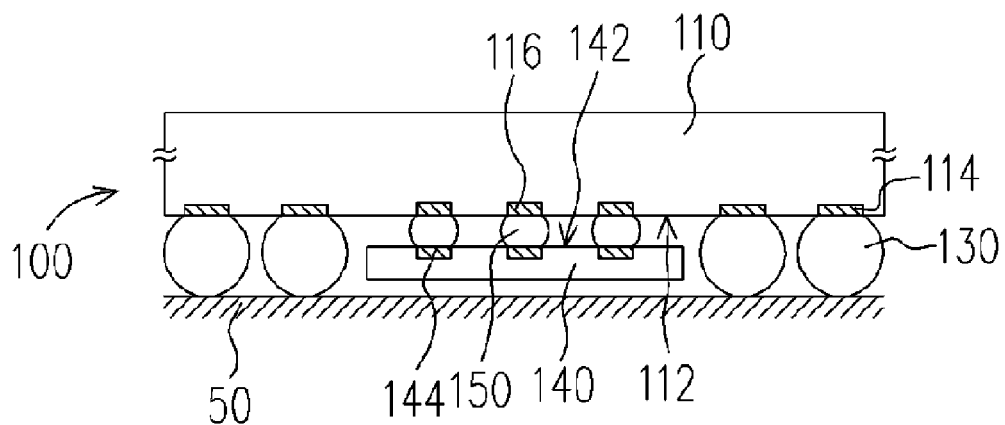
FIG. 1 is a schematic cross-sectional view of a conventional multi-chip package structure.
Figure 2:
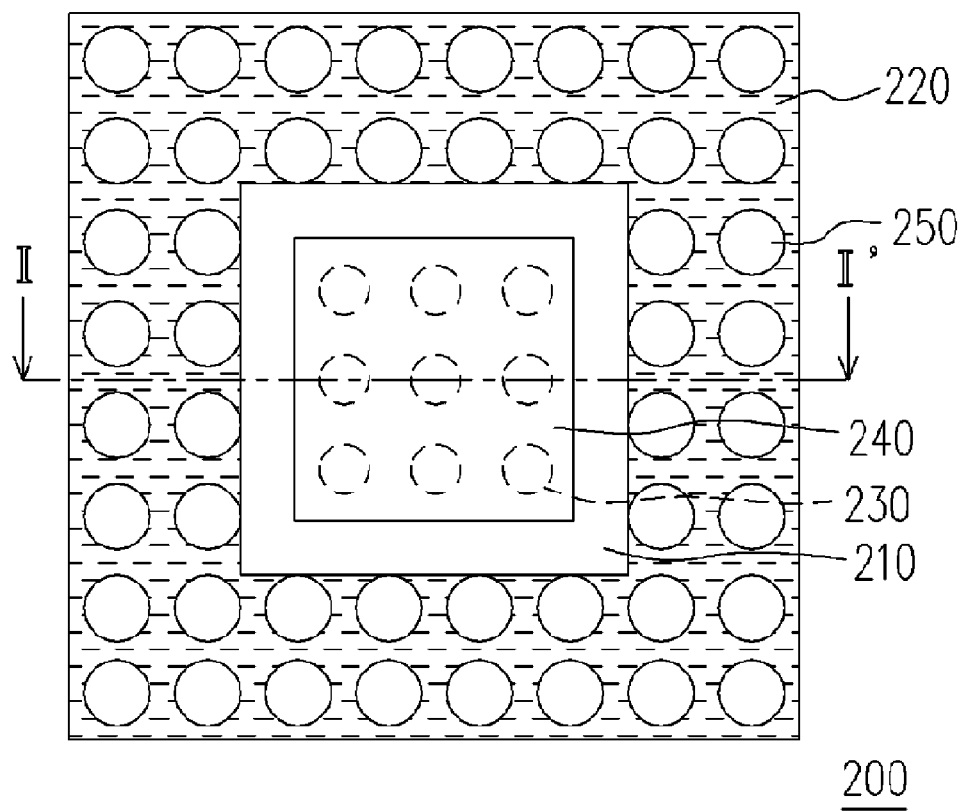
FIG. 2 is a schematic bottom view of a multi-chip package structure according to the first embodiment of the present invention.
Figure 3:
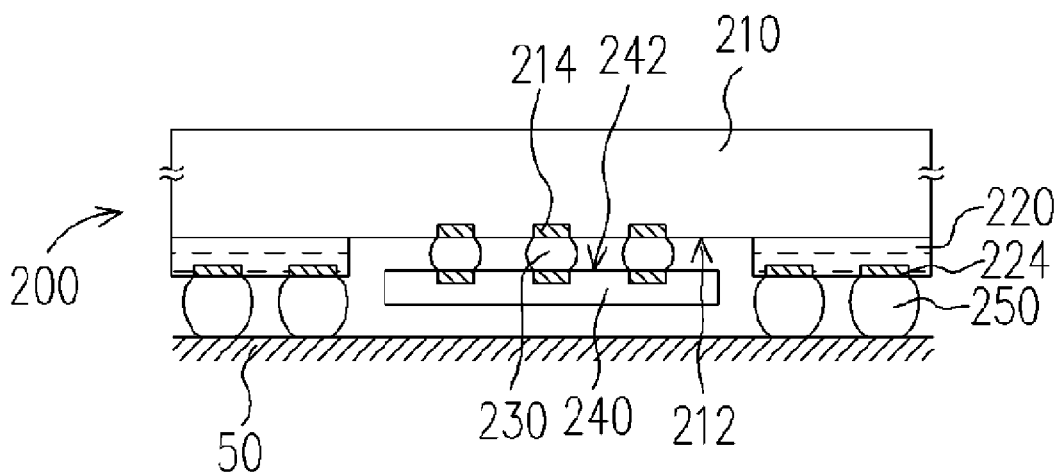
FIG. 3 is a schematic cross-sectional view along line I–I' in the FIG. 2.

FIG. 2 is a schematic bottom view of a multi-chip package structure according to the first embodiment of the present invention, and FIG. 3 is a schematic cross-sectional view along line I–I' in the FIG. 2.

Referring to FIG. 2 and FIG. 3, a multi-chip package structure 200 in accordance with the present invention includes a first chip 210, a patterned lamination layer 220, a plurality of first bumps 230, a second chip 240 and a plurality of second bumps 250. The first chip 210 has a first active surface 212. The patterned lamination layer 220 is disposed on a portion area of the first active surface 212. The first chip 210 has a plurality of first bonding pads 214 disposed on the first active surface 212 exposed by the patterned lamination layer 220 and the patterned lamination layer 220 has a plurality of second bonding pads 224 disposed thereon. The second chip 240 has a second active surface 242 and the first bumps 230 are disposed on the second active surface 242. The second chip 240 is electrically connected to the first bonding pads 214 through the first bumps 230. The second bumps 250 are disposed on the second bonding pads 224.

In the embodiment of the present invention, the size of the second chip 240 is smaller than an area of the first active surface 212 exposed by the patterned lamination layer 220, such that the mechanical interference between the second chip 240 and the patterned lamination layer 220 is prevented.

Referring to FIG. 2, the patterned lamination layer 220 is a ring type pattern or a multi-stripe type pattern, for example. The pattern of the patterned lamination layer 220 is determined by the shape or location of the second chip 240 and layout of the first bonding pads 214 and the second bonding pads 224. The patterned lamination layer 220 is, for example, a re-distribution circuit layer, such that the input/output terminals of the first chip 210 are electrically connected to the second bonding pads 224 via the circuit formed in the patterned lamination layer 220. In an embodiment of the present invention, the patterned lamination layer 220 is, for example, a component circuit layer that is electrically integrated with the first chip 210. In other words, functional components, such as resistors, capacitors or inductors, are formed in the component circuit layer.

Referring to FIG. 3, the multi-chip package structure 200 mentioned above further comprises a carrier 50 (only a portion of the carrier is shown in FIG. 3) that is electrically connected to the first chip 210 through the second bumps 250. In an embodiment of the present invention, the patterned lamination layer 220 has a first thickness T1, the second chip 240 has a second thickness T2, each first bump 230 has a first height H1 and each second bump 250 has a second height H2, wherein T1+H2>T2+H1. In this way, the second chip 240 is not in contact with the carrier 50 after the first chip 210 is mounted on the carrier 50.

Moreover, the melting point of the first bumps 230 is preferable higher than that of the second bumps 250, such that reliability of the connection between the first chip 210 and the second chip 240 can be improved. More specifically, when performing a reflow process to connect the first chip 210 and the carrier 50 through the second bumps 250, the first bumps 230 will not melt again. In another embodiment of the present invention, the melting point of the first bumps 230 is, for example, equal to that of the second bumps 250, such that reliability of the connection between the first chip 210 and the second chip 240 can also be improved. In this embodiment, since pre-solder (not shown) having melting point lower than that of the first bumps 230 is provided between the carrier 50 and the second bumps 250, the connection (bonding process) between the first chip 210 and the carrier 50 is performed at a lower temperature.

Second Embodiment

Figure 4:
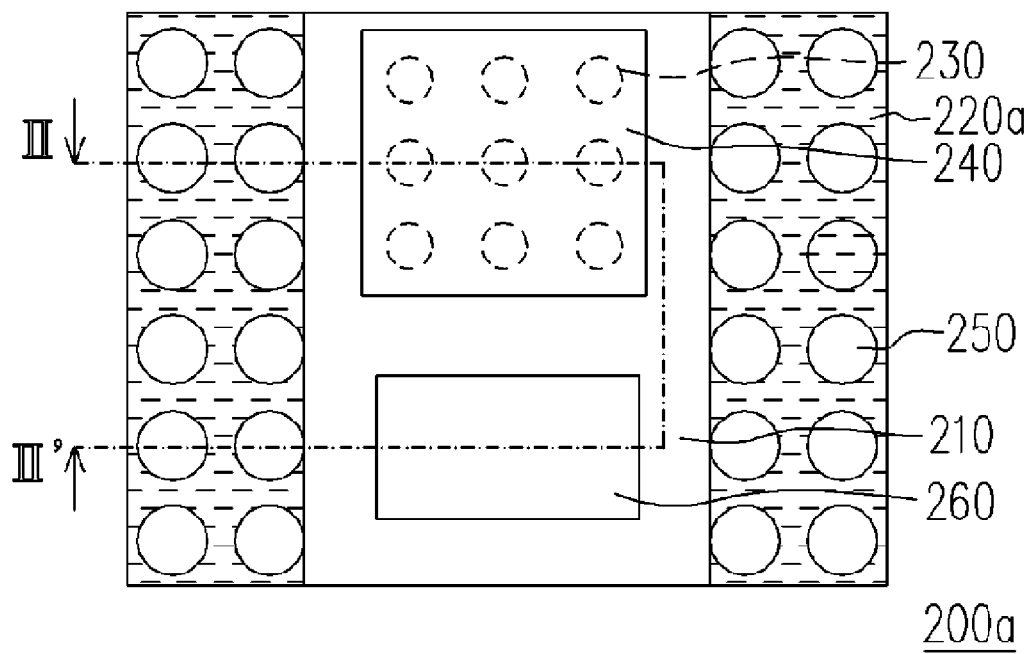
FIG. 4 is a schematic bottom view of a multi-chip package structure according to the second embodiment of the present invention.
Figure 5A:
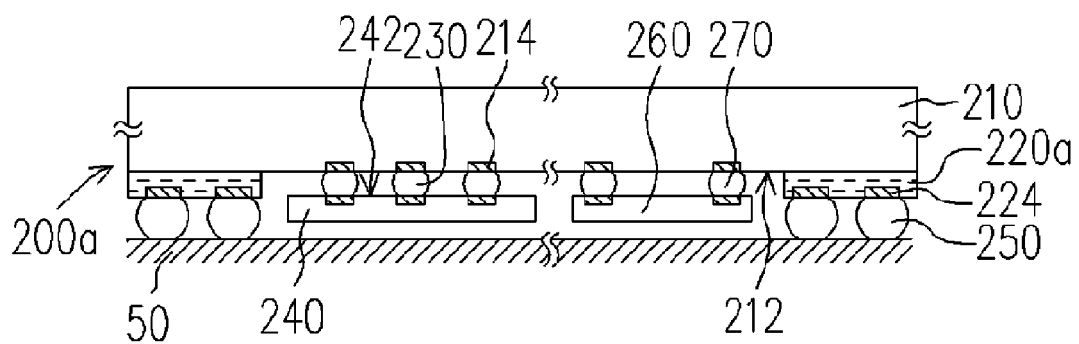
FIG. 5A and FIG. 5B are schematic cross-sectional views along line II–II' in the FIG. 4.
Figure 5B:
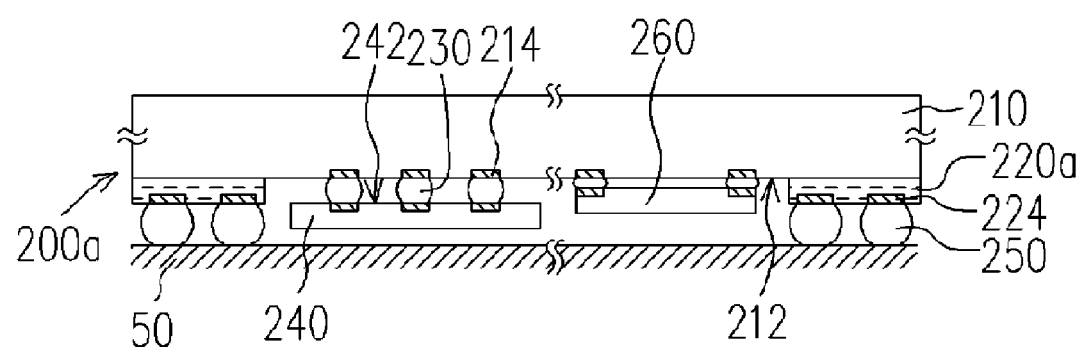

FIG. 4 is a schematic bottom view of a multi-chip package structure according to the second embodiment of the present invention, and FIG. 5A and FIG. 5B are schematic cross-sectional views along line II–II' in the FIG. 4.

Referring to FIG. 4, FIG. 5A and FIG. 5B, the multi-chip package structure 200a of this embodiment is similar to the first embodiment. The multi-chip package structure 200a includes a first chip 210, a patterned lamination layer 220a, a plurality of first bumps 230, a second chip 240, a plurality of second bumps 250 and at least one component 260.

It should be noted that the component 260 is disposed on the first chip 210 and electrically connected to a portion of the first bonding pads 214, which are not electrically connected to the second chip 240.

Referring to FIG. 4, the patterned lamination layer 220a of this embodiment is, for example, a multi-stripe type pattern. However, the patterned lamination layer 220a may also be a ring type pattern or other required patterns. Furthermore, in this embodiment, the first active surface 212 of the first chip 210 exposed by the patterned lamination layer 220a capable of accommodating the second chip 240 and at least one component 260.

Referring to FIG. 5A, the multi-chip package structure 200a further includes a plurality of third bumps 270 disposed on a portion of the first bonding pads 214, which are not electrically connected to the second chip 240. In other words, the component 260 is electrically connected to the first chip 210 through the third bumps 270 disposed therebetween by flip-chip bonding technique.

Referring to FIG. 5B, in the multi-chip package structure 200a, the component 260 may be a surface mount device that is mounted on the first chip 210 via conductive paste (not shown). In an embodiment of the present invention, the conductive paste is silver paste, Sn/Pb solder paste or lead-free solder paste, for example.

The foregoing description of the embodiments of the present invention has been presented for purposes of illustration. It is not intended to be exhaustive or to limit the invention to the precise form or to exemplary embodiments disclosed, form or quantity of the chip and the component and the relationship between the chip and the component can be reasonably modified.

As described above, the present invention at least provides the following advantages.

1. Since the patterned lamination layer is disposed on a portion of the active surface of the first chip, the space for accommodating the second chip, the second bumps and other component are enlarged.

2. Since the patterned lamination layer is disposed on a portion of the active surface of the first chip, reliability of the connection between the first chip and the second chip is improved, and feasibility of manufacturing the multi-chip package structure is enhanced.

3. In the present invention, a re-distribution circuit layer or a component circuit layer can be formed in the patterned lamination layer.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A multi-chip package structure, comprising:
   a first chip, having a first active surface;
   a patterned lamination layer, disposed directly on a portion area of the first active surface, wherein the first chip has a plurality of first bonding pads disposed on the first active surface exposed by the patterned lamination layer and the patterned lamination layer has a plurality of second banding pads disposed thereon;
   a plurality of first bumps;
   a second chip, having a second active surface, wherein the first bumps are disposed on the second active surface and the second chip is electrically connected to the first bonding pads through the first bumps; and
   a plurality of second bumps, disposed on the second bonding pads.

2. The multi-chip package structure of claim 1, wherein a size of the second chip is smaller than an area of the first active surface exposed by the patterned lamination layer.

3. The multi-chip package structure of claim 1, wherein the patterned lamination layer comprises a ring type pattern or a multi-stripe type pattern.

4. The multi-chip package structure of claim 1, wherein the patterned lamination layer comprises a re-distribution circuit layer.

5. The multi-chip package structure of claim 1, wherein the patterned lamination layer comprises a component circuit layer electrically integrated with the first chip.

6. The multi-chip package structure of claim 1, wherein the patterned lamination layer has a first thickness $T1$, the second chip has a second thickness $T2$, each first bump has a first height $H1$ and each second bump has a second height $H2$, and $T1+H2>T2+H1$.

7. The multi-chip package structure of claim 1, further comprising a carrier electrically connected to the first chip through the second bumps.

8. A multi-chip package structure, comprising:
   a first chip, having a first active surface;
   a patterned lamination layer, disposed directly on a portion of the first active surface, wherein the first chip has a plurality of first bonding pads disposed on the first active surface exposed by die patterned lamination layer and the patterned lamination layer has a plurality of second bonding pads disposed thereon;
   a plurality of first bumps;
   a second chip, having a second active surface, wherein the first bumps are disposed on the second active surface and the second chip is electrically connected to a portion of the first bonding pads through the first bumps;
   a component, disposed on the first chip, wherein the component is electrically connected to the other first bonding pads of the first chip; and
   a plurality of second bumps, disposed on the second bonding pads.

9. The multi-chip package structure of claim 8, wherein a size of the second chip is smaller than an area of the first active surface exposed by the patterned lamination layer.

10. The multi-chip package structure of claim 8, wherein the patterned lamination layer comprises a ring type pattern or a multi-stripe type pattern.

11. The multi-chip package structure of claim 8, wherein the patterned lamination layer comprises a re-distribution circuit layer.

12. The multi-chip package structure of claim 8, wherein the patterned lamination layer comprises a component circuit layer electrically integrated with the first chip.

13. The multi-chip package structure of claim 8, wherein the component comprises a surface mount device.

14. The multi-chip package structure of claim 8, further comprising a plurality of third bumps disposed on the other first bonding pads such that the component is electrically connected to the first chip.

15. The multi-chip package structure of claim 8, wherein the patterned lamination layer has a first thickness $T1$, the second chip has a second thickness $T2$, each first bump has a first height $H1$ and each second bump has a second height $H2$, and $T1+H2>T2+H1$.

16. The multi-chip package structure of claim 8, further comprising a carrier electrically connected to the first chip through the second bumps.

* * * * *